United States Patent [19]

Decker et al.

[11] Patent Number: 5,405,688
[45] Date of Patent: Apr. 11, 1995

[54] EPOXY RESIN/AMINOPOLYSILOX-ANE/AROMATIC OLIGOMER COMPOSITE

[75] Inventors: Gary T. Decker; Gerald A. Gornowicz, both of Midland County, Mich.; Kuniaki Tobukuro, Otsu, Japan

[73] Assignee: Dow Corning Corporation, Midland, Mich.

[21] Appl. No.: 262,289

[22] Filed: Jun. 20, 1994

Related U.S. Application Data

[62] Division of Ser. No. 226,908, Apr. 13, 1994.

[51] Int. Cl.$^6$ .................... B32B 17/04; B32B 27/04
[52] U.S. Cl. .................... 428/272; 428/273; 428/294; 428/408; 428/704; 428/902
[58] Field of Search ............ 428/272, 273, 294, 408, 428/704, 902; 525/393, 476; 528/38; 556/424, 425

[56] References Cited

U.S. PATENT DOCUMENTS

| | | | |
|---|---|---|---|
| 3,655,420 | 4/1972 | Tichenor | 525/523 |
| 4,657,986 | 4/1987 | Isayama et al. | 525/476 |
| 5,049,627 | 9/1991 | Edelman | 525/476 |

FOREIGN PATENT DOCUMENTS

| | | | |
|---|---|---|---|
| 2846489 | 7/1979 | Germany | 525/476 |
| 0128463 | 7/1959 | U.S.S.R. | 525/476 |

*Primary Examiner*—Robert E. Sellers
*Attorney, Agent, or Firm*—Robert L. McKellar

[57] ABSTRACT

A fiber-reinforced composite is prepared from fibers embedded in a composition comprising cured epoxy resin(s), an aromatic oligomer such as a polyether optionally with reactive primary amine groups, and an amino-functional silicone resin with monophenyl siloxy units and amino-functional siloxy units.

1 Claim, 2 Drawing Sheets

EPOXY RESIN/AMINOPOLYSILOXANE/AROMATIC OLIGOMER COMPOSITE

This is a divisional of copending application Ser. No. 08/226,908 filed on Apr. 13, 1994, now allowed.

BACKGROUND OF THE INVENTION

This invention relates to certain new high modulus silicones, toughened epoxy thermoset resin systems made from those silicones, and composites that are prepared from the new toughened epoxy resin systems.

Epoxy resins, one of the most widely used engineering resins are well-known for their use in composites which utilize high strength fibers. Articles can be manufactured from epoxy resins which are lighter in weight than the same articles manufactured from metals yet retain equivalent strength and stiffness. To date, epoxy composites have been relatively brittle due to the brittleness of the matrix resin. This brittleness restricts the wider application of certain composites because of the obvious problems associated therewith.

This problem has been attacked in a variety of ways, for example, Rowe, E. H. and Siebert, A. R., Mod. Plast. 47, 110 (1970 and McGarry, F. J., Proc. Roy. Soc. Lond. A., 319, 59 (1970) have used linear polybutadiene-polyacrylonitrile copolymers to toughen epoxy resins. Such an approach works to toughen the laminates from such modified epoxy resins, but there is a drastic loss of hot-wet properties.

Jabloner, et al., in U.S. Pat. No. 4,656,207, issued on Apr. 7, 1987, discloses the use of amino terminated polysulfones to toughen epoxy resins. These polysulfones are much more effective toughening agents than polybutadiene-polyacrylonitrile copolymers. These polysulfones also increase the toughness of the laminates made from the epoxy resins. However, these polysulfones must be used at high levels, at least forty weight percent or more, so that the viscosity of mixed epoxy resins is increased.

Organofunctional polysiloxanes have been used in combination with epoxy resins, but not in the toughening sense. For example, Hirose, et al, in European Patent Publication 0 293,733 A2 disclose a curable polymer composition. More particularly, they disclose a curable composition comprising an epoxy resin and an organic elastomeric polymer having in the molecule, at least one silicon-containing group which is crosslinkable through formation of a siloxane bond through a silicon-containing reactive group. This material is easily formulated into a one pack type composition and curable even at room temperature and affords a cured product having improved mechanical properties such as toughness and strength. Thus, they have provided a copolymer, which is elastomeric in nature, and is not indicated as being useful For toughening epoxy resins in composite applications.

In other polysiloxane combinations with epoxy resins, Yorkgitis and coworkers, Yorkitis, E. M.; Tran, C.; Eiss, Jr., N. S.; Hu, T. Y.; Yilgor, I.; Wilkes, G. L. and McGrath, J. E.; "Siloxane Modifiers for Epoxy Resins" in Adv. Chem. Ser. 208 (Rubber Modified Thermoset Resins) 137 to 161, (1984), have used essentially linear aminoalkyl endblocked random copolymers of diphenyl-dimethyl-siloxanes and random copolymers of methyltrifluoropropyl-dimethylsiloxanes to toughen epoxy resins. These materials have been found by Yorkgitis et al to toughen about as effectively as the commercial polybutadiene-polyacrylonitrile copolymers described supra, but these materials also cause a drastic loss of hot-wet properties of the composite.

Yorkgitis et al have correctly stated that "A toughened material, by definition, features improvements in fracture resistance without substantial loss of mechanical strength or modulus." Yorkgitis et al then illustrate that the above-mentioned oligomeric polysiloxanes only slightly influenced the flexural modulus of the base epoxy resin, stating "As expected, the flexural modulus does decrease as rubber content increases. The decrease is less severe as either TFP (trifluoropropylmethyl-polysiloxane) or DP (dimethylpolysiloxane) content increases."

From what is disclosed in the prior art, it thus appears that essentially linear or essentially elastomeric organofunctional polysiloxanes are known, but they have not been used effectively to toughen epoxy resins for use in composite applications.

Therefore, it was unexpected that hard, brittle organofunctional silicone resins would toughen a hard, glassy, brittle, thermoset epoxy resin. In other words, the inventors herein believe that this is the first disclosure of the use of a hard brittle organopolysiloxane resin to toughen a hard brittle epoxy resin.

SUMMARY OF THE INVENTION

It is therefore an objective of this invention to provide novel phenyl-containing and aminofunctional-containing siloxane resins. It is a further objective to provide blended silicone-epoxy compositions that are useful in preparing composite structures having increased fracture toughness over epoxy resins not containing the novel silicones of this inventions, while retaining essentially all of the mechanical and hot-wet properties of the original, untoughened epoxy resin.

The composites prepared using the blended silicone-epoxy resins of this invention have, in addition, thermostability for high temperature applications and, the ability to provide low water pickup by the cured composites.

This invention therefore comprises a toughened epoxy resin system, certain organofunctional polysiloxanes useful in toughening the epoxy resin system, and composites made from such toughened epoxy resin systems.

In one aspect therefore, this invention comprises a composition of matter comprising a blend of (A) a curable epoxy resin, or a mixture of curable epoxy resins, and (B) an amino functional silicone resin comprising the units (i) $PhSiO_{3/2}$ (ii) $R_2SiO$ and (iii) aminofunctional siloxy radicals selected from the group consisting essentially of a. $H_2NR^iSiO_{3/2}$, b. $R^{iv}HNR^{ii}SiO_{3/2}$, c. $(R^{iv}HNR^{ii})_{3-y}(R^v)_ySiO_{1/2}$, d. $(H_2NR^{ii})_{3-x}(R^v)_xSiO_{1/2}$ and, e. mixtures of a, b, c, and d, wherein Ph is the phenyl radical; each R is independently selected from phenyl and alkyl groups of 1 to 3 carbon atoms with the provisio that when R is an alkyl radical in each case, there can be no more than 10 weight percent of (ii) in the silicone resin and with the further provisio that when one R is an alkyl radical and one R is a phenyl radical on the same silicon atom, there can be no more than 15 weight percent of (ii) present in the silicone resin; $R^i$ is a divalent hydrocarbon radical selected from alkylene, arylene, alkarylene, and aralkylene having 1 to 10 carbon atoms, and —$R^{ii}NHR^{iii}$—, wherein $R^{ii}$ and $R^{iii}$ are each independently selected from alkylene, arylene, alkarylene and aralkylene of 1 to 10 carbon atoms; each of x and y have a value of 0, 1, or 2; $R^{iv}$ is selected from methyl, ethyl, propyl or phenyl; $R^v$ is selected from methyl and phenyl, and the aminofunctional silicone resin has an —NH— equivalent in the range of 350 to 1000.

Another aspect of this invention are the novel hard, brittle, resinous organofunctionalpolysiloxanes (amino functional silicone resins) that provide the toughening of the epoxy resins comprising an amino functional silicone resin comprising the units (i) $PhSiO_{3/2}$ (ii) $R_2SiO$ and (iii) aminofunctional siloxy radicals selected from the group consisting essentially of a. $H_2NR^iSiO_{3/2}$, b. $R^{iv}HNR^{ii}SiO_{3/2}$, c. $(R^{iv}HNR^{ii})_{3-y}(R^v)_ySiO_{1/2}$, d. $(H_2NR^{ii})_{3-x}(R^v)_xSiO_{\frac{1}{2}}$ and, e., mixtures of a, b, c, and d, wherein Ph is the phenyl radical; each R is independently selected from phenyl and alkyl groups of 1 to 3 carbon atoms with the provisio that when R is an alkyl radical in each case, there can be no more than 10 weight percent of (ii) in the silicone resin and with the further provisio that when one R is an alkyl radical and one R is a phenyl radical on the same silicon atom, there can be no more than 15 weight percent of (ii) present in the silicone resin; $R^i$ is a divalent hydrocarbon radical selected from alkylene, arylene, alkarylene, and aralkylene having 1 to 10 carbon atoms, and —$R^{ii}NHR^{iii}$—, wherein $R^{ii}$ and $R^{iii}$ are each independently selected from alkylene, arylene, alkarylene and aralkylene of 1 to 10 carbon atoms; each of x and y have a value of 0, 1, or 2; $R^{iv}$ is selected from methyl, ethyl, propyl or phenyl; $R^v$ is selected from methyl and phenyl, and the aminofunctional silicone resin has an —NH— equivalent in the range of 350 to 1000.

Yet another aspect of this invention is a composite that is prepared from the toughened epoxy resins of this invention, the invention comprising (I) a cured epoxy resin, or a mixture of cured epoxy resins containing therein an amino functional silicone resin comprising the units (i) $PhSiO_{3/2}$, (ii) $R_2SiO$ and (iii) aminofunctional siloxy radicals selected from the group consisting essentially of a. $H_2NR^iSiO_{3/2}$, b. $R^{iv}HNR^{ii}SiO_{3/2}$, c. $(R^{iv}HNR^{ii})_{3-y}(R^v)_ySiO_{1/2}$, d. $(H_2NR^{ii})_{3-x}(R^v)_xSiO_{1/2}$ and, e. mixtures of a, b, c, and d, wherein Ph is the phenyl radical; each R is independently selected from phenyl and alkyl groups of 1 to 3 carbon atoms with the provisio that when R is an alkyl radical in each case, there can be no more than 10 weight percent of (ii) in the silicone resin and with the further provisio that when one R is an alkyl radical and one R is a phenyl radical on the same silicon atom, there can be no more than 15 weight percent of (ii) present in the silicone resin; $R^i$ is a divalent hydrocarbon radical selected from alkylene, arylene, alkarylene, and aralkylene having 1 to 10 carbon atoms, and —$R^{ii}NHR^{iii}$—, wherein $R^{ii}$ and $R^{iii}$ are each independently selected from alkylene, arylene, alkarylene and aralkylene of 1 to 10 carbon atoms; each of x and y have a value of 0, 1, or 2; $R^{iv}$ is selected from methyl, ethyl, propyl or phenyl; $R^v$ is selected from methyl and phenyl, and the aminofunctional silicone resin has an —NH— equivalent in the range of 350 to 1000, said composite having, (II) reinforcing fibers embedded therein prior to cure.

A final aspect of this invention is a process of preparing cured, reinforced, toughened epoxy resin-containing laminates, said process comprising (I) blending an aminofunctional silicone resin with at least one curable epoxy resin, at least one epoxy hardener; (II) impregnating reinforcing fibers with said blend; (III) laying up at least two layers of the impregnated fibers to form a laminate; (IV) heating the laminate at a temperature sufficient and for a length of time sufficient to cure the epoxy resin, whereby a cured, reinforced, toughened epoxy resin-containing composite is obtained.

DETAILED EXPLANATION OF THE INVENTION

For purposes of this invention, the novel organofunctional polysiloxanes that are contemplated within the scope of this invention are those that are compatible or readily dispersible with the epoxy resin and the curing agent for the epoxy resin. Further, the inventors herein consider that silicone resins which are readily dispersible in the epoxy resin to give a homogeneous and uniform dispersion are also within the scope of this invention. This compatibility/dispersibility requirement pertains to the silicone modified epoxy resin in the uncured state. Those siloxane resins that are not compatible or readily dispersible with the epoxy resin and its curing agent in the uncured state are not considered to be within the scope of the invention claimed herein. However, it must be understood that the silicone resins useful herein are those that must separate and form a separate phase in the epoxy resin and curing agent, as the cure of the epoxy resin takes place.

The separation phenomena is dependent on the N—H equivalent of the polysiloxane resin, the composition of the polysilicone resin, and the composition of the epoxy resin being used, along with its curing agent.

Certain aminofunctional organopolysiloxanes are known in the prior art. For example, there is disclosed in British patent 942,587, the preparation of aminofunctional resins similar to those disclosed and claimed in this invention that were found useful in modifying varnishes and lacquers. Some of the polysiloxane resins from the British patent have amine equivalents that fall near those described for the polysiloxane resins of the instant invention, but none of the polysiloxane resins of the British Patent form part of the polysiloxane resins of the instant invention, as their amine equivalents do not fall in the critical ranges described for the polysiloxanes resins of the instant invention. Thus, as can be observed, none of the resins of the reference are those claimed in the instant invention.

Therefore, the aminofunctional silicone resins that are useful in the instant invention comprise the units (i) $PhSiO_{3/2}$; (ii) $R_2SiO$, and (iii) aminofunctional siloxy radicals selected from the group consisting essentially of a. $H_2NR^iSiO_{3/2}$, b. $R^{iv}HNR^{ii}SiO_{3/2}$, c. $(R^{iv}HNR^{ii})_{3-y}(R^v)_ySiO_{1/2}$, d. $(H_2NR^{ii})_{3-x}(R^v)_xSiO_{1/2}$, and, e. mixtures of a, b, c, and d, wherein Ph is the phenyl radical; each R is independently selected from phenyl and alkyl groups of 1 to 3 carbon atoms with the provisio that when R is an alkyl radical in each case, there can be no more than 10 weight percent of (ii) in the silicone resin and with the further provisio that when one R is an alkyl radical and one R is a phenyl radical on the same silicon atom, there can be no more than 15 weight percent of (ii) present in the silicone resin; $R^i$ is a divalent hydrocarbon radical selected from alkylene, arylene, alkarylene, and aralkylene having 1 to 10 carbon atoms, and —$R^{ii}NHR^{iii}$—, , wherein $R^{ii}$ and $R^{iii}$ are each independently selected from alkylene, arylene, alkarylene and aralkylene of 1 to 10 carbon atoms; each of x and y have a value of 0, 1, or 2; $R^{iv}$ is selected from methyl, ethyl, propyl or phenyl; $R^v$ is selected from methyl and phenyl, and the aminofunctional silicone resin has an —NH— equivalent in the range of 350 to 1000.

Thus, the aminofunctional silicone resin units R$_2$SiO can be selected such that R is independently selected from phenyl, and alkyl groups of 1 to 3 carbon atoms such as, for example, units comprising dimethylsiloxy, phenylmethylsiloxy, diphenylsiloxy, methylpropylsiloxy and phenylpropylsiloxy, and the like. For purposes of this invention, when R is an alkyl radical in each case, there can be no more than 10 weight percent of this type of siloxy unit in the silicone resin, and further, when one R is an alkyl radical and one R is a phenyl radical on the same silicon atom, there can be no more than 15 weight percent of this type of siloxy unit present in the silicone resin.

R$^i$ for purposes of this invention is a divalent hydrocarbon radical selected from alkylene, arylene, alkarylene, and aralkylene having 1 to 10 carbon atoms, and —R$^{ii}$NHR$^{iii}$—, wherein R$^{ii}$ and R$^{iii}$ are each independently selected from alkylene, arylene, alkarylene and aralkylene of 1 to 10 carbon atoms. Thus, the preferred R$^i$ for this invention has from 2 to 8 carbon atoms, and most preferred is a divalent radical having three carbon atoms. R$^i$ is also most preferred to be three carbon atoms. R$^{iii}$ is preferably the methyl or phenyl radical with methyl being the most preferred. R$^{iv}$ is selected from methyl, ethyl, propyl or phenyl and R$^v$ is selected from methyl and phenyl, with methyl being preferred in both cases.

The amount of amine in the silicone resin that is required to achieve the properties of the cured epoxy resin in this invention is an amount that has an —NH— equivalent in the range of 350 to 1000. More preferred are silicone resins having an —NH— equivalent in the range of 400 to 900, and most preferred are those silicone resins having an —NH— equivalent in the range of 500 to 800.

Further, the amount of aminofunctional silicone resin that can be used varies depending on the component siloxy units. Typically, the silicone resin can be used in amounts ranging from 5 weight percent to 30 weight percent of the blend of silicone resin and epoxy resin. The amount of the silicone resin to use can be determined by the initial solubility or dispersibility of the silicone resin in the uncured epoxy resin. It is known by the inventors herein that when the silicone resin contains (CH$_3$)$_2$SiO units, only up to about 10% of the silicone resin can be used in the blend. Further, it is known by the inventors herein that when (Ph)(CH$_3$)SiO units are used, the silicone resin can be used in the blend in up to 20 weight percent. It is further known by the inventors herein that certain materials of this invention, i.e., those having no diphenylsiloxy units work only in certain epoxy resin systems. A simple solubility test to help determine if the silicone resin is useful in this invention is described in the preamble to the examples.

The epoxy thermoset resins and the composites of this invention can be obtained from a thermosetting epoxy resin composition (A) comprising (a) at least one polyepoxy component having a glass transition temperature below about 50° C. and (b) at least one epoxy hardener.

It is not uncommon to blend reactive epoxy resins to optimize physical and other properties and the inventors herein contemplate such a use in this invention.

The polyepoxy components contain at least 2 epoxy groups and preferably are aromatic polyepoxy compounds having between 2 and about 4 epoxy groups per molecule and glass transition temperatures below 50° C. Suitable polyepoxy compounds are resorcinol diglycidyl ether {1,3-bis-(2,3-epoxypropoxy)benzene} marketed, for example, by Wilmington Chemical as HELOXY ® 69; diglycidyl ether of bisphenol A {2,2-bis(p-{2,3-epoxypropoxy}phenyl)propane}; triglycidyl p-aminophenol {4-(2,3-epoxypropoxy)-N,N-bis{2,3-epoxypropyl)aniline}; diglycidyl ether of bromobispehnol A {2,2-bis(4-{2,3-epoxypropoxy)3-bromo-phenyl)-propane; diglydicylether of Bisphenol F (2,2-bis(p-(2,3-epoxypropoxy)phenyl)methane); triglycidyl ether of meta and/or para-aminophenol (3-(2,3-epoxypropoxy)N,N-bis(2,3-epoxypropyl)aniline); and tetraglycidyl methylene dianiline (N,N,N',N'-tetra(2,3-epoxypropyl) 4,4'-diaminodiphenyl methane) or mixtures of two or more polyepoxy compounds can be used in this invention. A more exhaustive list of the epoxy resins found useful in this invention can be found in Lee, H. and Neville, K., Handbook of Epoxy Resins, McGraw-Hill Book Company, 1982 reissue.

Another embodiment of this invention is the use of an aromatic oligomer and therefore, the epoxy thermoset resins and the composites of this invention can be obtained from a thermosetting epoxy resin composition (A) comprising (a) at least one polyepoxy component having a glass transition temperature below about 50° C.; (b) at least one epoxy hardener; (c) at least one aromatic oligomer that is reactive with (a) or (b), or (a) and (b), and which has a molecular weight (number average) between about 2000 and 10,000 and a glass transition temperature between about 120° C. and 250° C.

The aromatic oligomers, contain functional groups which are reactive with the polyepoxy components and/or the epoxy hardeners of the composition. In a preferred embodiment the oligomer is epoxy reactive and has at least about 1.4 epoxy reactive groups per molecule. The reactive aromatic oligomer preferably contains divalent aromatic groups such as phenylene, diphenylene or napthalene groups linked by the same or different divalent non-aromatic linking groups. Such linking groups are for example, oxygen, sulfonyl, oxyalkylene or oxyalkyleneoxy such as —OR— or —ORO— wherein R is lower alkylene preferably with 1 to 3 carbon atoms; lower alkylene or alkylidene such as —R— or —R(R$^1$)$_y$— wherein R and R$^1$ are independently lower alkylene and y is 1 or 2; ester groups such as —(R$^1$)$_x$COO(R$^2$)$_y$— wherein R$^1$ and R$^2$ are independently lower alkylene preferably with 1 to 3 carbon atoms and x and y are independently zero or 1; and oxoalkylene—(R$^1$)COR$^2$)$_y$—, wherein R$^1$ and R$^2$ are independently lower alkylene where x and y are independently zero or 1. The aromatic units may be substituted with non-interfering substitutents such as chlorine, lower alkyl, phenyl and the like. Generally, at least twenty-five percent of the total number of carbon atoms in the reactive aromatic oligomer will be in aromatic structures, and preferably at least about 50% of the total carbon atoms are in aromatic structures.

The preferred reactive aromatic oligomers comprise polyethers and more preferably polyethers having two different types of units. A portion, preferably greater than half of these units, are aromatic.

Also preferred, are aromatic or cycloaliphatic units that are not bridged, for example, napthalene, or are bridged by groups which are essentially nonpolar, examples of which are alkylidene, such as isopropylidene bridges.

The reactive aromatic oligomers preferably have reactive groups that are terminal groups on the oligomer backbone and more preferably are reactive groups at the ends of oligomeric backbones which have little or no branching. The preferred reactive groups of the reactive aromatic oligomer are primary amine, hydroxyl, carboxyl, anhydride, thio, secondary amine and epoxy. Especially preferred are reactive aromatic oligomers having at least about 1.7 reactive groups per molecule and having at least about seventy percent of the total number of reactive groups present as primary amine groups.

The epoxy hardener can be any compound with an active group capable of reacting with the epoxy group. Preferably, it can be selected from compounds with amino, acid, anhydride or azide group. More preferably the epoxy hardener is an aromatic diamine such as a diaminodiphenyl-sulfone; a methylenedianiline such as 4,4'-methylenedi-aniline; a diaminodiphenylether; benzidine; 4,4'-thiodi-aniline: 4-methoxy-6-m-phenylenediamine; 2,6-diaminopyridine; 2,4-toluenediamine; and dianisidine. Alicyclic amines such as methane diamine and heterocyclic amines such as pyridine may also be employed. In some cases, aliphatic amines such as secondary alkylamines which are normally fast reacting hardeners can be used alone or in combination with other epoxy hardeners provided the concentration and/or curing temperature are sufficiently low to permit control of the curing rate. Other fast reacting hardeners which can be employed for making the epoxy resins of the invention are dicyandiamide and boron trifluoride.

Other ingredients and adjuvants such as catalysts, modifiers, and the like can be present provided their presence and amount does not destroy the advantages of the invention.

The epoxy resins and the composites of this invention can be produced conventionally, the only alteration in such a practice is the introduction of the siloxanes of this invention to the epoxy resins before they are cured.

Curing of the epoxy resins containing the siloxane of this invention usually requires a temperature of at least about 40° C., and up to about 200° C. for periods of minutes up to hours. Post Treatments can be used as well, such post treatments ordinarily being at temperatures between about 100° C. and 200° C. Preferably, curing is staged to prevent exotherms, staging preferably commencing at temperatures below about 180° C.

The epoxy resin matrices of this invention are particularly useful in composites containing high strength filaments or fibers such as carbon (graphite), glass, boron and the like. Composites containing from about 30% to about 70%, more preferably about 40% to 70%, of these fibers based on the total volume of the composite are preferred in making composite structures.

A preferred manner of making the prepregs is by hot melt prepregging. The prepregging method is characterized by impregnating bands or fabrics of continuous fiber with the thermosetting epoxy resin and silicone resin composition in molten form to yield a prepreg which is layed up and cured, to provide a composite of fiber and thermoset resin containing the siloxane.

Generally, for hot melt processing it is preferred to select a polyepoxide component having a Tg below 50° C. and an aminofunctional silicone resin which provide a mixed epoxy resin having a viscosity of between about 100 and 10,000 centipoise more preferably between 200 and about 5,000 centipoise at 100° C. In hot melt prepregging the combination of polyepoxy component, aminofunctional silicone resin and hardener preferably has a viscosity below 15,000 centipoises at 100° C.

Other processing techniques can be used to form composites containing the epoxy resin thermoset of this invention. For example, filament winding, solvent prepregging and pultrusion are typical processing techniques in which the uncured epoxy resin can be used. Moreover, fibers in the form of bundles can be coated with the uncured epoxy resin composition, layed up as by filament winding and cured to form the composites of this invention.

The epoxy resin matrices and composites of this invention are particularly useful as structures for the aerospace industry and as circuit boards and the like for the electronics industry, as well as for the formation of skis, ski poles, fishing rods, and other outdoor sports equipment.

TESTING PROCEDURES

Preparation of Castings for Testing

A solution of the material to be tested was poured into molds made from two pieces of glass. Each of the pieces of glass were treated on the surfaces which would contact the solution with Dow Corning ® 20, a silicone release coating. The glass mold consisted of two glass plates, having narrow strips of cured silicone rubber spacers about 2 to 3 mm thick on their interior surfaces around the outside perimeter, except for one edge, to provide a spacer between the two glass pieces to allow a hollow into which the solution could be poured. The glass pieces were about 150 mm square to give a molded piece of about 22,500 mm square and 2 to 3 mm thick. The glass molds were preheated at 110° C. before the resin was poured into them. At 110° C., the solution was poured into the mold through the open edge using a funnel and up to the level of the top of the glass plates. The resulting castings were kept at 110° C. until all of the air had escaped from the casting leaving a smooth surface, essentially free of air bubbles, against the glass. The temperature was then raised to 130° C. and kept at this temperature for 2 to 4 hours to gel the epoxy resin. The castings were then cured by raising the temperature to 180° C. at a rate of 0.208° C./minute. The temperature was kept at 180° C. for 2 hours and then cooled to room temperature at a rate of 1.3° C./minute.

Measurement of Fracture Toughness ($G_{1c}$)

The cured modified epoxy resins were tested by the method as essentially taught in Lee, S. M., "Double Torsion Fracture Toughness Test For Evaluating Transverse Cracking in Composites", Journal of Materials Science Letters 1 (1982) 511 to 515. Three mm thick composite samples were cut into two pieces 60×120 mm. A wide scratch is made from the notch down the center of the sample with a plastic cutter. Then a deeper cut was made in the scratch with a razor carpet knife. The Fracture toughness, $G_{1c}$, of the sample was measured with an Instron Model 1122 using the apparatus as shown essentially in Lee, supra. The sample is placed on the holder with the cut side down and the edges on top of the stainless steel rods. The notch is placed between the stainless steel balls. Pressure is applied to the sample until it cracks. The crosshead is stopped as soon as the sample cracks and the force (P,Kg force.) required to crack the sample, the distance the crosshead moved (d, mm) and the length of the crack (a, mm) are measured. The crosshead speed used was 1 mm/min. The crosshead was activated again and the process was continued until the sample broke. $G_{1c}$ is calculated using the following equation:

$$G_{1c} = (P^2/2t)(dC/da) \ \{Kgf(mm)/MM^2\}$$

where t=thickness at the part of the crack extension and C is the compliance. The compliance C is obtained by dividing the distance (d) the crosshead moves by P. The value of dC/da is obtained from the slope of a plot of C versus a. $G_{1c}$ is measured for each crack. The first value in each case was discarded because abnormally high force is required to make the first crack. The average of the $G_{1c}$ values of the remaining cracks is then reported as the $G_{1c}$ of the sample. The $G_{1c}$ values reported herein are usually an average of four samples.

Flexural Modulus Testing

Flexural Modulus on the samples was carried out by using Dow Corning Corporate Test Method No. 0491A entitled "Flexural Strength-Rigid and Semirigid Plastics". It is based on ASTM Test D 790 and uses a Baldwin Universal Test Machine. The 1984 version has a reference number ASTM 790-84A and is entitled "Flexural Properties of Unreinforced and Reinforced Plastics and Electrical Insulating Materials". The results are reported in kg/mm$^2$. The silicone materials of the instant invention provide toughening of the epoxy resins while essentially not decreasing the flexural modulus of the toughened epoxy resin. The materials useful in this invention should not decrease the flexural modulus of the cured resin by more than about 11 percent.

Water Absorption Testing

Water absorption tests were conducted on the samples by taking the pieces from the flexural modulus test that were approximately 2 mm thick, weighing them to get a base weight and then wrapping them in cheese cloth to suspend them in boiling water. Periodically each sample was removed, wiped dry and weighed. The percent weight increase from an initially dry sample to the weight of the removed, wiped dry sample are reported as "% increase".

EXAMPLE 1

Preparation of Non-Aminofunctional Siloxane Resins

Non-aminofunctional silicone resins which do not fall within the scope of this invention, were also tested in order to compare them to the aminofunctional silicone resins to determine if non-aminofunctional resins would provide the appropriate properties in the composite in conjunction with the epoxy resins and also to show the superiority of the resins of the instant invention. The resins used are typical silicone resins that do not contain any amine functionality. They were prepared by the well-known method of hydrolysis of chlorosilanes as set forth in Eaborn, C., "Organosilicon Compounds", Butterworths Scientific Publications London 1960 pp. 227 et seq.

OS-1 had a high phenyl content and consisted of 40 mol % phenylsiloxy units, 45 mol % methylsiloxy units, 10 mol % diphenylsiloxy units, and 5 mol % phenylmethylsiloxy units.

OS-2 consisted of 70 mol % phenylsiloxy units and 30 mol % propylsiloxy units.

For convenience, the OS resin compositions are set forth in table form on Table I.

OS-1 and OS-2 were each tested in a curable epoxy resin system. Epon 828, curable by DDS was treated with 30 weight % of OS-1 and OS-2 in separate samples, respectively, using toluene solutions of the silicone resins. The toluene was removed by heating the solutions in a 150° C. oil bath. Castings were attempted. With OS-2, the silicone precipitated as gel particles after the DDS was dissolved and this mixture was not cast. OS-1 gave a clear solution and was cast. During the cure, the silicone phase separated, but settled to the bottom of the casting instead of forming a uniform dispersion throughout the casting. Neither material toughens cured epoxy resins because of the exhibited behaviour as shown below.

| SILICONE | COMPATIBILITY | |
|---|---|---|
| | MY 720 | EPON 828 |
| OS-1 | insoluble | soluble |
| OS-2 | disperses | soluble |

TABLE I

| Non-Aminofunctional Silicone Resins | | |
|---|---|---|
| SILICONE | COMPONENTS | (mol %) |
| OS-1 | *PhSiO$_{3/2}$ | 40 |
| | CH$_3$SiO$_{3/2}$ | 45 |
| | Ph$_2$SiO | 10 |
| | PhCH$_3$SiO | 5 |
| OS-2 | PhSiO$_{3/2}$ | 70 |
| | PrSiO$_{3/2}$ | 30 |

*Ph is Phenyl and Pr is Propyl.

Preparation of Aminofunctional Silicone Resins

An example of the preparation of aminofunctional silicone resins comprises adding 5.7 mols (1128.6 g) of phenyltrimethoxysilane to xylene (1500 g) in a 5-liter, round-bottomed, glass flask equipped with an air operated stirrer, water cooled reflux condenser, an addition funnel and a thermometer. This mixture was heated to 70° C. and a solution of conc. HCl (2 ml., 0.0893 mol) in water (500 ml) was slowly added to the mixture. CAUTIOUS ADDITION of the acidic water was undertaken to avoid potential violent exothermic reactions which is attributable to the solubility of water in the xylene owing to the presence of by-produced methanol from the hydrolysis that takes place. After all of the acidic water was added, the reaction was heated at reflux for one hour. The reaction mass was cooled to below 60° C. and then there was added to the existing reaction mass, KOH (20.96 g, 0.374 mol), octaphenylcyclotetrasiloxane (212 g, 1.07 eq) and aminopropyltrimethoxysilane (179 g, 1.0 mol). A Dean-Stark azeotrope trap was then attached to the condenser and the mixture heated to reflux. Water was azeotroped from the mixture. The methanol caused poor separation of the organic and aqueous phases and considerable xylene remained with the aqueous phase. Additional xylene (1000 ml) was added to replace the xylene lost with the water. After all of the water had been removed, the reaction was heated at reflux overnight (about 16 hrs.). Acetic acid (23.58 g, 0.374 mole) was then added to the reaction mass. Upon cooling to room temperature, the reaction appeared cloudy whereupon it was filtered using nitrogen pressure. The filtrate was poured into baking dishes and the xylene was allowed to evaporate in a hood. Residual xylene was removed in a vacuum oven at 5 Torr and about 100° C. A white appearing, glassy material was obtained. This material was weak and friable.

Gel Permeation Chromatography analysis indicated it to be a resin having an average molecular weight of about 1790. In determining the above molecular weight, a sample of the material was treated with acetic anhydride to convert the existing amine functionality of the sample to amide, to prevent the amine from being absorbed onto the packing in the Gel Permeation columns. In this manner, the molecular weight values of the material are not skewed. A sample was then dissolved in toluene and titrated with perchloric acid in acetic acid using methyl violet indicator to give an amine equivalent of 1088. This value converts to an amine-hydrogen (—NH—) equivalent of 544 because there are two amine hydrogens per nitrogen atom. This material is hereinafter designated as NH-1.

NH-2 was prepared identically to NH-1 except that the quantity of octaphenylcyclotetrasiloxane was doubled while the other reagents were kept the same.

NH-3 was a resin containing 36/55/8 weight percent of phenylsiloxy units/diphenylsiloxy units/aminopropylsiloxy units at 60% solids in xylene wherein the precursor phenyltrimethoxysilane was hydrolyzed with 250 ml of water and 2 ml of concentrated hydrochloric acid, using a procedure similar to the preparation of NH-1.

NH-4 was prepared as in NH-1 except that the diphenyl units were replaced with dimethyl units.

NH-5 was prepared as in NH-1 except that the diphenyl units were replaced with phenylmethyl units.

NH-6 was prepared as in NH-1, except that the amount of the aminofunctional silane used was doubled. Also, 2000 ml of xylene was used initially instead of 1500 to accomodate the xylene that was lost during the azeotroping of the water that was formed by the reaction. The quantities of water, hydrochloric acid, potassium hydroxide and acetic acid used were identical to that used above.

NH-7 was prepared without any phenyltrimethoxysilane, that is, the final resin did not have any $PhSiO_{3/2}$ units in it. Three hundred thirty three grams of xylene were used to give 60% solids. No hydrochloric acid was used. The potassium hydroxide (0.6 g, 0.011 mol) was dissolved in 20 to 30 ml of water. The excess water was azeotroped from the reaction mixture and the reaction mass was heated at reflux overnight. Additional solvents, toluene (250 ml) and THF (250 ml) were used to reduce the viscosity of the solution so it would filter more easily. After filtering the mixture, the solvent was allowed to evaporate from the filtrate. The amine equivalent was calculated initially to be close to that of NH-1.

NH-8 was prepared as in NH-1 except that the amount of amine was halved.

For convenience, the composition and properties of these resins are set forth on Table II.

TABLE II

| AMINO-FUNCT. SILOXANE NO. | FINAL RESIN COMPOSITION* | | | NH (eq) | Mol. wt. (Mw) |
|---|---|---|---|---|---|
| | phenyl siloxy | diphenyl siloxy | aminoalkyl siloxy | | |
| NH-1 | 69.6 | 20.0 | 10.4 | 544 | 1790 |
| NH-2 | 53.3 | 30.7 | 16.0 | 356 | 5160 |
| NH-3 | 36.1 | 55.4 | 8.5 | 672 | 740 |

TABLE II-continued

| AMINO-FUNCT. SILOXANE NO. | FINAL RESIN COMPOSITION* | | | NH (eq) | Mol. wt. (Mw) |
|---|---|---|---|---|---|
| | phenyl siloxy | diphenyl siloxy | aminoalkyl siloxy | | |
| NH-4 | 79.3 | 8.7 | 12.0 | 519 | — |
| NH-5 | 74.1 | 14.5 | 11.2 | 570 | — |
| NH-6 | 63.0 | 18.2 | 18.8 | 338[1] | 2700 |
| NH-7 | 00.0[2] | 90.1 | 9.9 | 672 | 1000 |
| NH-8 | 80.9 | 13.3 | 5.8 | 1035[3] | — |

*IN WEIGHT PERCENT
SAMPLES NH-6 through 8 are not within the scope of this invention.
[1] the —NH— equivalent is too low.
[2] the resin does not contain $PhSiO_{3/2}$.
[3] the —NH— equivalent is too high.

Epoxy Resin Preparation

This method was used for essentially all of the epoxy resin examples shown in this specification and is at least one method by which curable epoxy resins can be prepared.

Araldite MY 720, a curable epoxy resin manufactured by Ciba-Geigy, having an epoxy equivalent weight of 124 (253.4 g, 2.01 epoxy equivalents), and 4,4'- diaminodiphenylsulfone (hereinafter DDS manufactured by the Aldrich Chemical Company, an epoxy resin hardener having an amine equivalent of 62 (124.8 g, 2.01 NH equivalents) were mixed in a 900 ml Freeze Dry Flask. The mixture was heated in a 150° C. oil bath until a clear solution was obtained. This material, having no silicone resin toughening agent was used as a control for plain epoxy resins and was designated Control-1.

One other curable epoxy resin used in these examples was Epon 828, manufactured by the Shell Chemical Company, having an epoxy equivalent of 191. This was Control-2.

Amino-Terminated Polysulfone Preparation

The amino-terminated polysulfone which is not within the scope of this invention, was compared herein against the materials of the instant invention and was prepared following the directions of Jabloner, et. al as set forth in Part A of the examples of the patent. The amine equivalent was 2820 and the Gel Permeation Chromatography analysis showed a molecular weight (Mw) of 5850 and (Mn) of 3770. The analyses agree quite closely with those of the Jabloner reference. This material was designated "polysulfone" and was tested for water absorption properties. (see FIG. 3).

Jabloner et al teach that the polysulfone must comprise 40 Weight % or more of the final resin composition. At 40 weight %, the polysulfone in MY 720/DDS gelled. At 20 weight % in MY 720/DDS, a good casting was obtained but testing did not give valid $G_{1c}$ results, because the test results were erratic.

Simple Test for Compatibility of Siloxane Resins with the Epoxy Resins

A silicone resin (0.5 g) was dissolved in toluene (5 ml) and the epoxy resin is added at the desired level. The resulting solution or mixture was placed in a 150° C. oil bath and the toluene allowed to evaporate. Compatibility of the siloxane with the epoxy resin was noted after all of the toluene had evaporated. If the resins are compatible, or the silicone resin is uniformly dispersed in the epoxy resin, after the toluene has evaporated, then the system is probably workable within the limitations of the invention described herein, provided the other critical limitations of this invention are met.

EXAMPLE 2

PREPARATION OF EPOXY RESIN TOUGHENED WITH SILICONE RESIN

Araldite MY 720 (150 g., 1.19 equiva.) and NH-1 (56.1 g, 0.1 equiv.) were placed in a 900 ml Freeze Dry Flask. Toluene (300 ml) was added and the mixture stirred at room temperature until clear in appearance. The flask was heated in a 150° C. oil bath for about 30 minutes. The toluene was allowed to evaporate during this time. Residual toluene was removed under reduced pressure. The flask was cooled to about 80° C., and then DDS (67.6 g, 1.09 eq.) was added and the mixture was stirred with a spatula until a smooth, homogeneous paste was obtained. The flask was put back into the oil bath until all of the DDS had dissolved, which was about 30 minute. This mixture did not become crystal clear but remained very slightly transluscent.

The results can be found on Tables III and IV.

TABLE III

RESULTS OF TESTING OF THE SILICONE TOUGHENED EPOXY RESIN COMPOSITES USING MY 720 AS THE EPOXY RESIN AND DDS AS THE HARDENER

| SAMPLE NUMBER | SILICONE ADDITIVE | % ADDITIVE | $G_{Ic}$ (N/m$^2$) | %[1] INC. | Flexural Modulus (Kg/mm$^2$) | % LOSS |
|---|---|---|---|---|---|---|
| *1 | NONE | 0 | 88 | — | 374 | — |
| 2 | NH-1 | 5 | 108 | 23 | 371 | <1.0 |
| 3 | NH-1 | 10 | 127 | 44 | 354 | 5.6 |
| 4 | NH-1 | 10 | 147 | 67 | NM | |
| 5 | NH-1 | 15 | 157 | 78 | 369 | 1.0 |
| 6 | NH-1 | 20 | 216 | 145 | 348 | 7.4 |
| 7 | NH-2 | 10 | 118 | 34 | 347 | 7.3 |
| 8 | NH-2 | 15 | 127 | 44 | 345 | 7.2 |
| 9 | NH-3 | 20 | 118 | 34 | 337 | 10.9 |
| 10 | NH-4 | 20 | 127 | 44 | 377 | NM |
| 11 | NH-5 | 20 | 154 | 75 | NM | |
| 12 | NH-6 | 5 | 59 | | 348 | |
| 13 | NH-6 | 10 | 88 | | 372 | <1.0 |
| 14 | NH-7 | 20 | 108 | 22 | 316 | 18.3 |
| 15 | NH-8 | 10 | | | (precipitated) | |
| 16 | HYCAR CTBN | 10 | 147 | 67 | 248 | 51 |

[1]% Inc. = % increase
NM = not measured
*control

TABLE IV

RESULTS OF TESTING OF THE SILICONE TOUGHENED EPOXY RESIN COMPOSITES USING EPON 828 AS THE EPOXY RESIN AND DDS AS THE HARDENER

| SAMPLE NUMBER | SILICONE ADDITIVE | % ADDITIVE | $G_{Ic}$ (N/m$^2$) | %[1] INC. | Flexural Modulus (Kg/mm$^2$) | % LOSS |
|---|---|---|---|---|---|---|
| **1 | NONE | 0 | 205 | — | 325 | — |
| 2 | NH-1 | 30 | 265 | 29 | 305 | 6.6+ |
| 3 | NH-1 | 30 | 343 | 67 | 312 | 4.2++ |

*CONTROL
+the powdered DDS was hard to disperse in the silicone/epoxy mixture.
++the powdered DDS was added as an acetone solution.

EXAMPLE 3

NH-1 was compared against a commercial organic material for its ability to toughen epoxy resins. The commercial material was CTBN (carboxy terminated butadiene/acrylonitrile copolymer as described supra in the specification.

Each material was solublized in hot, uncured MY 720 and DDS and each solution was cast into a glass mold as described above. After curing, the silicone containing material was translucent, indicating that the phase separation required in this invention had occurred. The CTBN sample was clear.

The amine functional silicone increased the fracture toughness by 2.5 fold over a cured epoxy control containing no silicone or CTBN, with less than 10% loss of flexural modulus. At 10 Weight %, the amine functional silicone and the CTBN gave comparable toughening, but at 20 Weight %, the silicone increased the $G_{Ic}$ by 2.5 fold. In addition, the CTBN causes an unacceptable loss of flexural modulus while the silicone does not.

EXAMPLE 4

Preparation of a Unidirectional Prepreg

A unidirectional prepreg composed of the following was prepared.
A. reinforcing fibers: Carbon fibers T300 made by Toray Industries, Inc., Japan.
B. Matrix resin: A resin composition composed of the following:
  1) Bisphenol A type epoxy resin, Epikote 834 made by Yuka Shell Epoxy K. K.
  2) Phenol novolac type epoxy resin, Epicron N-740 made by Dainippon Ink & Chemicals, Inc.
  3) Dicyan diamide made by Japan Carbide.
  4) 3-(3,4-dichlorophenyl)-1,1-dimethylurea made by Dupont, Wilmington, Del.
  5) NH-1 aminofunctional siloxane resin as described above.

The materials were used in the following amounts:

| COMPONENT | AMOUNT (in parts) |
|---|---|
| 1 | 64.0 |
| 2 | 35.0 |
| 3 | 3.5 |
| 4 | 4.0 |
| 5 | 11.8 (10 weight %) |

The resin content in the prepreg was 35%. The amount of resins per unit area was 78 g/m² and the amount of carbon fibers per unit area was 145 g/m². Composite laminates were laid up and were cured at 130° C. for 2 hours in an autoclave. Laminate tensile properties were determined using specimens as defined in ASTM D3039 and laminate compressive strengths were determined using specimens as defined in ASTM D695.

Double cantilever beam specimens ({0}26, 33.02×1.27 cm) were used to measure mode I critical strain energy release rate $G_{1c}$. Teflon strips were inserted into the laminates at their midplanes to control crack initiation. Open angle during tests were kept below 15° in order to avoid large displacement effects. Crosshead speed was 2.5 mm/min. The results are shown below.

TABLE V

| SILICONE ADDITIVE | % ADDITIVE | $G_{Ic}$ (Kgf.mm/mm²) | 0° TENSILE STRENGTH (Kgf/mm²) | 0° COMPRESSIVE STRENGTH (Kgf/mm²) |
|---|---|---|---|---|
| none | 0 | 0.0136 | 163 | 163 |
| NH-1 | 10 | 0.0192 | 165 | 162 |

EXAMPLE 5

A material of this invention, NH-1 was tested for water adsorption abilities.

Figure 1:
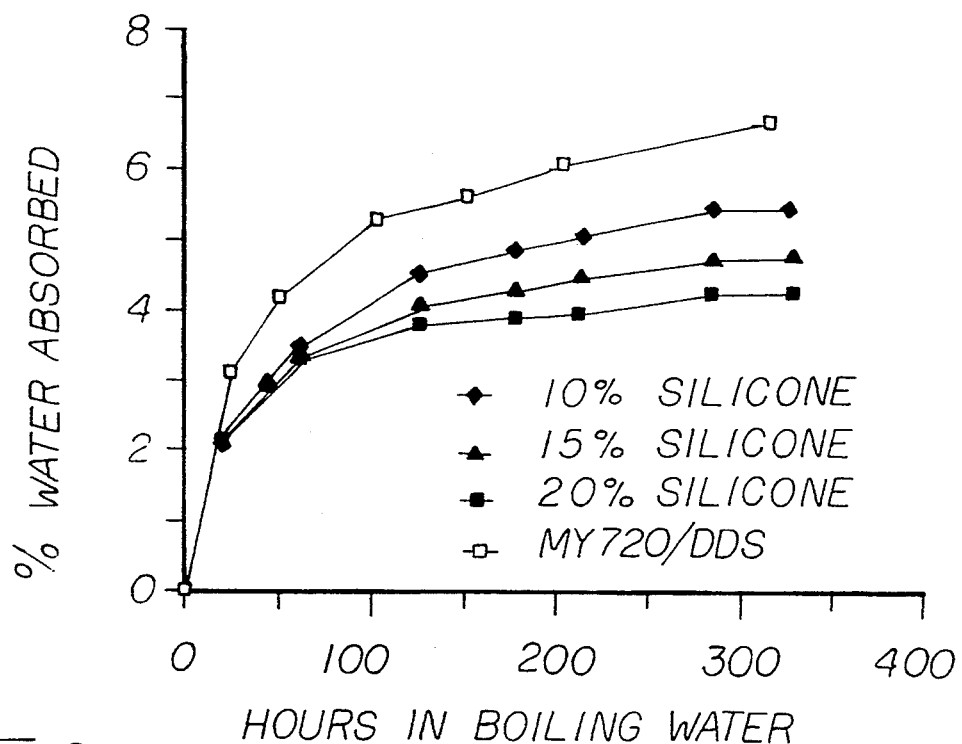
FIG. 1 shows the amount of water adsorbed by an epoxy resin system, MY 720/DDS, with various levels of NH-1.
Figure 2:
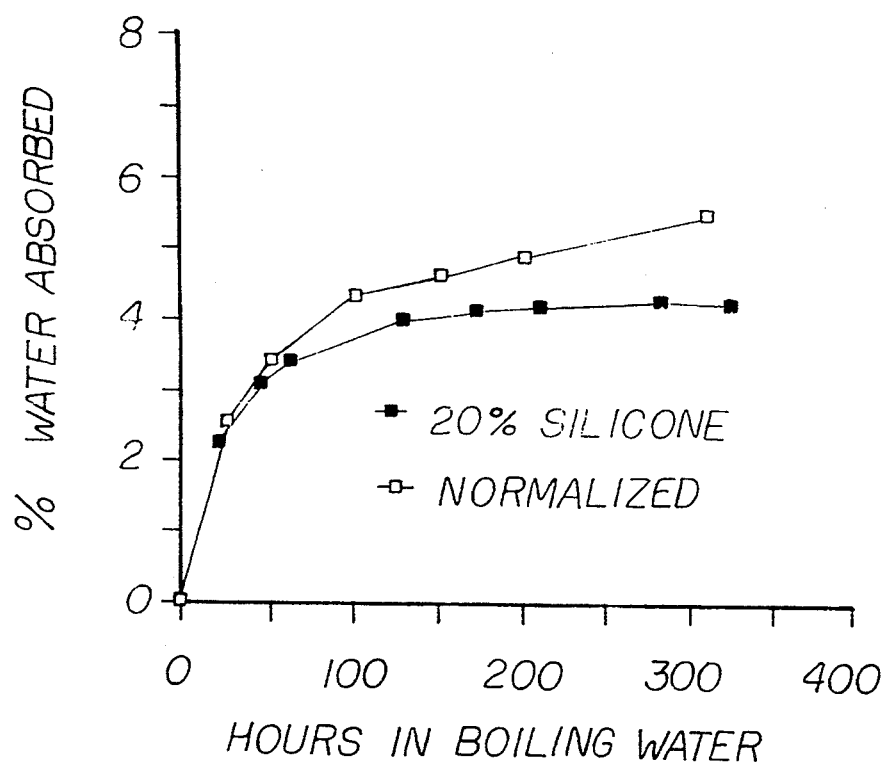
FIG. 2 shows the water absorption of NH-1 using the untreated MY 720/DDS epoxy resin as a control.
Figure 3:
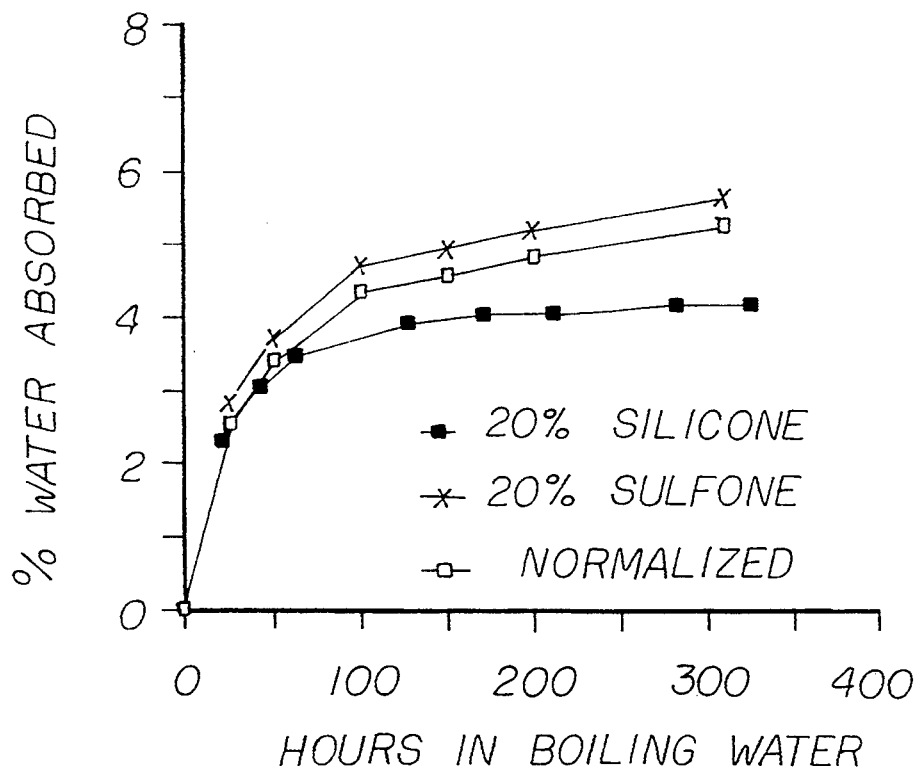
FIG. 3 shows the water absorption of NH-1 compared against polysulfone and using the untreated epoxy resin as a control.
Figure 4:
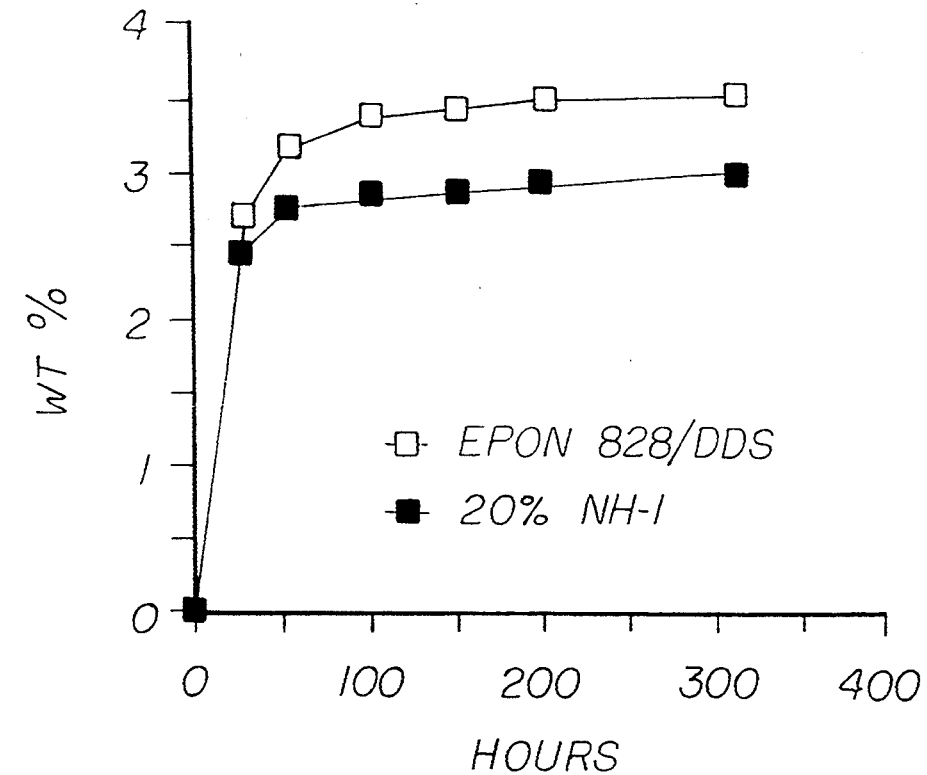
FIG. 4 shows the water absorption of NH-1 using the untreated Epon 828/DDS epoxy resin as a control.

That which is claimed is:

1. A composite comprising:
   (I) a cured epoxy resin or a mixture of cured epoxy resins, containing therein at least one aromatic oligomer and an aminofunctional silicone resin, said aminofunctional silicone resin comprising the units
      (i) $PhSiO_{3/2}$,
      (ii) $R_2SiO$ and,
      (iii) aminofunctional siloxy units selected from the group consisting of
         a. $H_2NR^iSiO_{3/2}$,
         b. $R^{iv}HNR^{ii}SiO_{3/2}$,
         c. $(R^{iv}HNR^{ii})_{3-y}(R^v)_ySiO_{\frac{1}{2}}$,
         d. $(H_2NR^{ii})_{3-x}(R^v)_xSiO_{\frac{1}{2}}$ and,
         e. mixtures of a, b, c, and d,
   wherein Ph is the phenyl radical; each R is independently selected from phenyl and alkyl groups of 1 to 3 carbon atoms with the proviso that when R in (ii) is an alkyl radical in each case, there can be no more than 10 weight percent of (ii) in the silicone resin and with the further proviso that when one R in (ii) is an alkyl radical and one R in (ii) is a phenyl radical on the same silicon atom, there can be no more than 15 weight percent of (ii) present in the silicone resin; $R^i$ is a divalent hydrocarbon radical selected from alkylene, arylene, alkarylene, and aralkylene having 1 to 10 carbon atoms, and $—R^{ii}NHR^{iii}—$, wherein $R^{ii}$ and $R^{iii}$ are each independently selected from alkylene, arylene, alkarylene and aralkylene of 1 to 10 carbon atoms; each of x and y have a value of 0, 1, or 2; $R^{iv}$ is selected from methyl, ethyl, propyl or phenyl; $R^v$ is selected from methyl and phenyl, and the aminofunctional silicone resin has an —NH— equivalent in the range of 350 to 1000, said composite having,
   (II) reinforcing fibers embedded therein prior to cure.

* * * * *